(12) United States Patent
Hirano et al.

(10) Patent No.: US 8,410,367 B2
(45) Date of Patent: Apr. 2, 2013

(54) ELECTRIC CONTACT MEMBER

(75) Inventors: Takayuki Hirano, Hyogo (JP); Akashi Yamaguchi, Hyogo (JP); Takashi Miyamoto, Hyogo (JP)

(73) Assignees: Kobe Steel, Ltd., Kobe-shi (JP); Kobelco Research Institute, Inc., Kobe-shi (JP)

( * ) Notice: Subject to any disclaimer, the term of this patent is extended or adjusted under 35 U.S.C. 154(b) by 203 days.

(21) Appl. No.: 12/895,050

(22) Filed: Sep. 30, 2010

(65) Prior Publication Data

US 2011/0214900 A1    Sep. 8, 2011

(30) Foreign Application Priority Data

Sep. 30, 2009    (JP) ................. 2009-228057

(51) Int. Cl.
  *H01B 5/00*    (2006.01)
(52) U.S. Cl. .................. 174/94 R; 174/126.2
(58) Field of Classification Search .......... 174/126.2, 174/94 R, 125.1; 204/290.03, 290.08, 290.15
See application file for complete search history.

(56) References Cited

U.S. PATENT DOCUMENTS

| | | | | |
|---|---|---|---|---|
| 5,422,307 | A | * | 6/1995 | Ishii ............................ 438/384 |
| 5,675,127 | A | * | 10/1997 | Kawanabe ................. 174/126.2 |
| 5,693,560 | A | * | 12/1997 | Hattori et al. ................. 257/473 |
| 7,374,647 | B2 | * | 5/2008 | Mundheim et al. ...... 204/290.08 |
| 7,934,962 | B2 | | 5/2011 | Hirano et al. |
| 2006/0040105 | A1 | | 2/2006 | Sato et al. |

FOREIGN PATENT DOCUMENTS

| | | |
|---|---|---|
| CN | 1419262 A | 5/2003 |
| JP | 10-226874 | 8/1998 |
| JP | 2002-318247 | 10/2002 |
| JP | 2003-231203 | 8/2003 |
| JP | 2007-24613 | 2/2007 |

OTHER PUBLICATIONS

Office Action issued on Nov. 24, 2011 in the corresponding Korean Patent Application No. 10-2010-94889 (with English Translation).
Office Action in Chinese Patent Application No. 201010298497.1, issued Nov. 14, 2012 with English translation.

* cited by examiner

*Primary Examiner* — Chau Nguyen
(74) *Attorney, Agent, or Firm* — Oblon, Spivak, McClelland, Maier & Neustadt, L.L.P.

(57) ABSTRACT

Provided is an electric contact member which reduces, to the utmost, peel-off of a carbon film that is caused at the time of use of the electric contact member having at least an edge to keep stable electric contact over a long period of time. Disclosed is an electric contact member which repeatedly contacts with a device under test at a tip part of the electric contact member in which the tip part has an edge, the electric contact member comprising: a base material; an underlying layer comprising Au, Au alloy, Pd or Pd alloy, which is formed on a surface of the base material of the tip part; an intermediate layer which is formed on a surface of the underlying layer; and a carbon film comprising at least one of a metal and a carbide thereof which is formed on a surface of the intermediate layer, wherein the intermediate layer has a lamination structure comprising: an inner layer comprising Ni or Ni alloy; and an outer layer comprising at least one of Cr, Cr alloy, W and W alloy.

5 Claims, 11 Drawing Sheets

FIG. 3
(a)
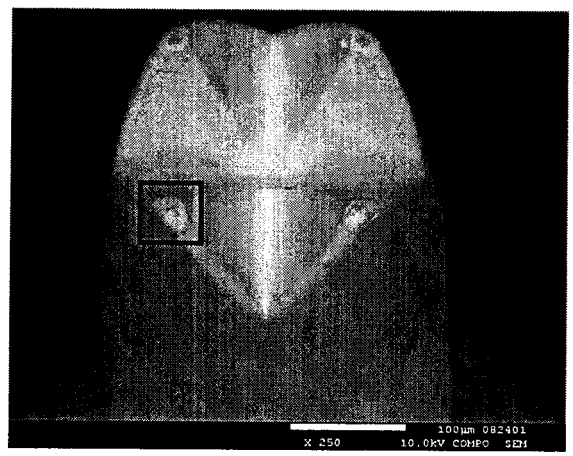
(b)

FIG. 5
(a)
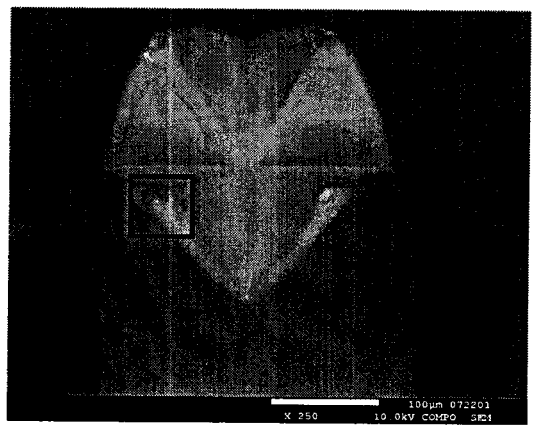
(b)

FIG. 11
(a)
(b)
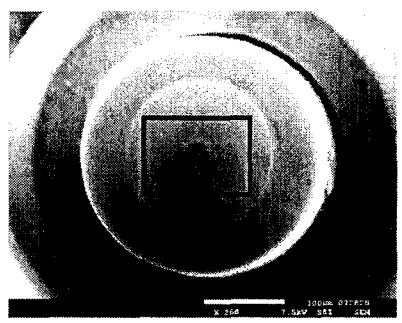
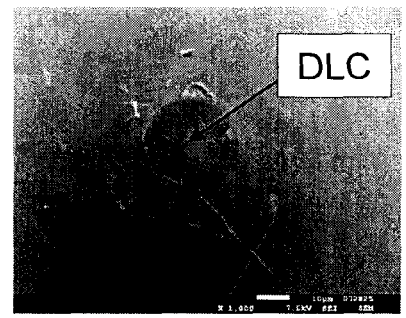
(c)
(d)
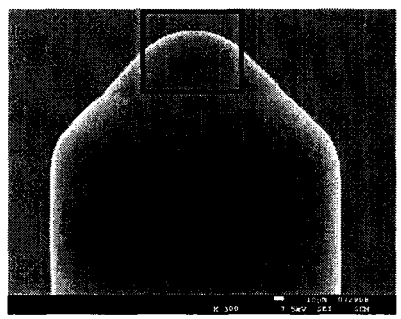
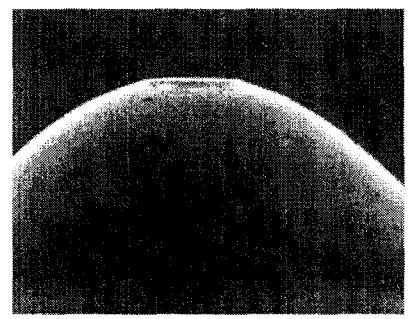

FIG. 12
(a)
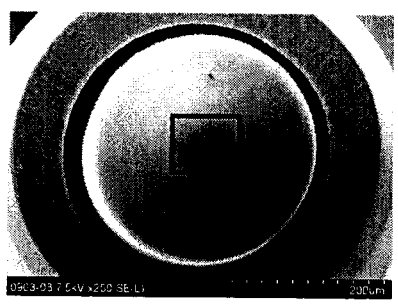
(b)
(c)
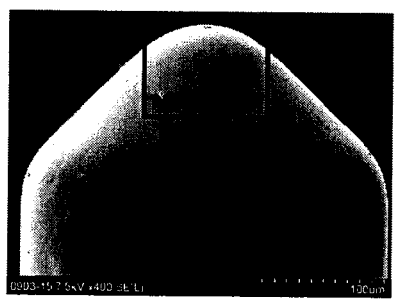
(d)
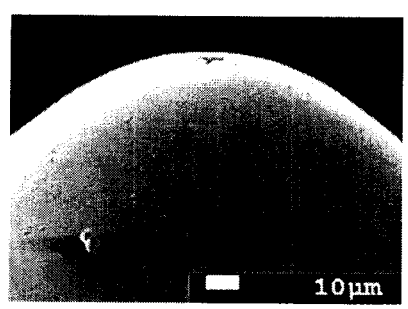

FIG. 13
(a)
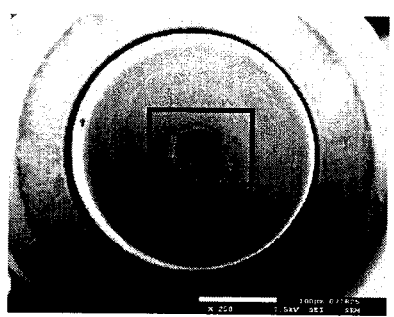
(b)
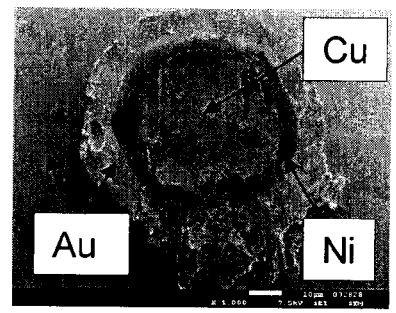
(c)
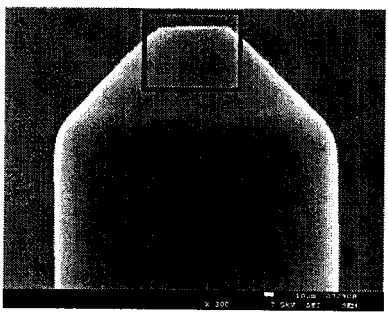
(d)
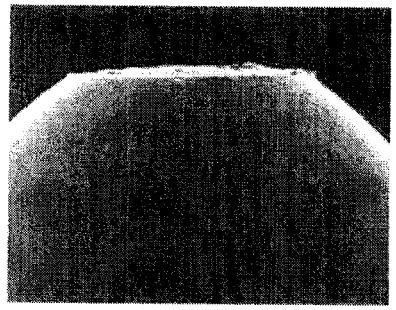

ELECTRIC CONTACT MEMBER

CROSS-REFERENCE TO RELATED APPLICATIONS

This application claims priority from Japanese Patent Application No. 2009-228057 filed on Sep. 30, 2009, the entire subject matter of which is incorporated herein by reference.

BACKGROUND OF THE INVENTION

1. Field of the Invention

The present invention relates to an electric contact member that is used for inspection of electric properties of a semiconductor element and repeatedly contacts with an electrode at a tip part of the electric contact member in which the tip part has an edge, and particularly to an electric contact member having excellent durability, which is not deteriorated in conductivity by repeated inspection. Incidentally, the electric contact member of the invention typically includes a contact probe (contact probe pin) formed in a pin shape (needle shape), but also includes, for example, one in a leaf spring shape and one in other shapes. In short, any electric contact member is included, as long as it repeatedly contacts with an electrode at a tip part of the electric contact member in which the tip part has an edge.

2. Description of the Related Art

In electronic parts (that is to say, electronic parts using semiconductor elements) such as integrated circuits (ICs), large-scale integrated circuits (LSIs) and light-emitting diodes (LEDs), electric properties thereof are inspected by bringing electric contact members to contact with electrodes of semiconductor elements. The electric contact members used in such inspection devices (semiconductor inspection devices) are required to have such excellent durability that wear or damage does not occur even by repeated contact with the electrodes as devices under test, as well as good conductivity (low contact resistivity).

Typical examples of the electric contact members (contact terminals) as described above include contact probe pins. The contact resistance of such electric contact members is generally set to 100 m$\Omega$ or less, but sometimes deteriorates to several hundred m$\Omega$ to several $\Omega$ by repeatedly contacting with the devices under test.

As a measure thereof, regular cleaning or replacement of the contact terminals has been conventionally carried out. However, this extremely reduces the reliability and operating rate of an inspection process in some cases, so that other measures have been studied. In particular, solder materials or Sn-plated electrodes have properties that surfaces thereof are easily oxidized, and scraped off because of their softness to easily adhere to the contact terminal side. It is therefore difficult to realize stable contact.

As a method for stabilizing the contact resistance of the electric contact member (hereinafter sometimes represented by "contact probe pin"), there has been proposed a technique of coating the vicinity of a tip part of the contact probe pin (a tip part contacting with an electrode and the vicinity thereof) with a carbon film (for example, JP-A-10-226874, JP-A-2002-318247, JP-A-2003-231203, JP-A-2007-24613). In this technique, it becomes an important requirement to allow an alloy element such as tungsten (W) to be mixed in the carbon film represented by diamond like carbon (DLC) to form a surface film having both low adhesive properties of the carbon film to the device under test (the electrode) and high conductivity due to the presence of the metal (or a carbide thereof) mixed in the carbon film.

SUMMARY OF THE INVENTION

However, the contact probe pin on which the carbon film is formed has a problem of low adhesiveness between a base material and the carbon film. The carbon film has low reactivity to the base material composed of a usual metal, so that it is difficult to obtain good adhesion. Further, it has been considered to be the cause of decreased adhesiveness that the carbon film generally has a low thermal expansion coefficient compared to the metal base material. That is to say, when the temperature is raised when forming the film, the film does not follow contraction of the base material due to the difference in thermal expansion therebetween. Accordingly, compressive stress remains in the film, resulting in a state where the film is easily peeled off.

In order to improve adhesion between the film and the base material, various solutions are also exemplified in the above-mentioned patent documents. For example, the above-mentioned JP-A-10-226874 shows a method of reducing internal stress of a carbon film, and JP-A-2002-318247 proposes a stepwise gradient composition layer between a carbon film and a base metal. Further, JP-A-2003-231203 exemplifies an intermediate layer such as a metal or nitride (for example, CrN) layer, and JP-A-2007-24613 exemplifies in its example to form an intermediate layer having a gradient composition comprising Cr film/Cr, graphite and W, thereby improving adhesion between a carbon film and a base material.

On the other hand, in the contact probe pin, a noble metal such as Au, Pd, Au alloy or Pd alloy is generally formed on a surface of the base material thereof or a contact portion thereof with the electrode. Further, in a contact probe pin having a spring inside thereof (this is referred to as a "spring probe pin"), the metal such as Au is generally formed also on the inside thereof contacting with the spring. In order to form the carbon film represented by the DLC film on the contact, it is necessary to form the carbon film with good adhesiveness to such a metal (hereinafter sometimes represented by "Au or Pd", including these). However, Au or Pd has low reactivity, and any technique for improving adhesiveness, particularly taking into account an underlying layer composed of such a material, has not hitherto been proposed, in an actual state. For example, when the DLC film is formed on the above-mentioned spring probe pin, an additional treatment such as removal of Au only on a tip part by etching is required in some cases, in order to achieve stable adhesion of the film.

Further, JP-A-2002-318247 exemplifies, in its example, "a socket contact for a BGA (ball grid alley) package, in which a base material obtained by Au plating on beryllium-copper alloy is processed into a plate shape, and an intermediate layer composed of chromium (Cr) or a carbide or nitride thereof and a carbon film are formed on a surface thereof". In the case of such a plate-shaped contact terminal (a terminal for a contact), compressive force mainly acts in a direction to press perpendicularly to the film, so that strong adhesion is not required for the film in use.

However, even such a plate-shaped contact terminal contains an edge (for example, a sharp corner portion or the like) at a tip part thereof in some cases, and stress also acts in a direction to shear the carbon film at that portion. In such a case, the carbon film is sometimes peeled off in continuous use (contact) for tens of thousands of times to cause a problem of failing to keep stable electric contact over a long period of times. In particular, the contact probe pin contacts with the device under test only at the sharp tip part thereof (this portion corresponds to the above-mentioned "edge"), so that the above-mentioned problem becomes prominent.

The invention has been made focusing on the circumstances as described above, and an object thereof is to provide an electric contact member in which such peel-off of a carbon film that poses a problem at the time of use of the electric contact member having at least an edge is reduced to the utmost to keep stable electric contact over a long period of time.

The invention encompasses the following embodiments.

(1) An electric contact member which repeatedly contacts with a device under test at a tip part of the electric contact member in which the tip part has an edge, the electric contact member comprising:

a base material;

an underlying layer comprising Au, Au alloy, Pd or Pd alloy, which is formed on a surface of the base material of the tip part;

an intermediate layer which is formed on a surface of the underlying layer; and a carbon film comprising at least one of a metal and a carbide thereof which is formed on a surface of the intermediate layer, wherein the intermediate layer has a lamination structure comprising: an inner layer comprising Ni or Ni alloy; and an outer layer comprising at least one of Cr, Cr alloy, W and W alloy.

(2) The electric contact member according to (1), wherein the metal contained in the carbon film is one or more kinds of metals selected from the group consisting of W, Ta, Mo, Nb, Ti and Cr.

(3) The electric contact member according to (1) or (2), wherein an amount of at least one of the metal and carbide thereof in the carbon film is from 10 to 30 atomic %.

(4) The electric contact member according to any one of (1) to (3), wherein a thickness of the carbon film is from 10 nm to 10 μm.

(5) The electric contact member according to any one of (1) to (4), wherein the device under test comprises Sn or Sn alloy.

According to the electric contact member of the invention, a carbon film comprising a metal and/or a carbide thereof is formed on a surface of an underlying layer comprising Au, Au alloy, Pd or Pd alloy, with the interposition of an intermediate layer having a predetermined lamination structure, thereby being able to form the carbon film on a surface of a base material with good adhesiveness. Thus, the electric contact member that can keep stable electric contact over a long period of time has been realized.

BRIEF DESCRIPTION OF THE DRAWINGS

FIG. 3(a) and FIG. 3(b) are scanning electron micrographs in substitution for a drawing, showing a state of a tip part after contact for 100,000 times at the time when a contact probe pin in Example 1 was used; and FIG. 3(b) is an enlarged view of the relevant part of FIG. 3(a).

FIG. 5(a) and FIG. 5(b) are scanning electron micrographs in substitution for a drawing, showing a state of a tip part after contact for 100,000 times at the time when a contact probe pin in Comparative Example was used; and FIG. 5(b) is an enlarged view of the relevant part of FIG. 5(a).

FIG. 11(a) to FIG. 11(d) are scanning electron micrographs in substitution for a drawing, showing a state of the surface of the contact probe pin after a contact test at the time when contact probe pin 4-1 in Example 4 was used; FIG. 11(a) and FIG. 11(b) are top views thereof and FIG. 11(b) is an enlarged view of the relevant part of FIG. 11(a); and FIG. 11(c) and FIG. 11(d) are side views thereof and FIG. 11(d) is an enlarged view of the relevant part of FIG. 11(c).

FIG. 12(a) to FIG. 12(d) are scanning electron micrographs in substitution for a drawing, showing a state of the surface of the contact probe pin after a contact test at the time when contact probe pin 4-2 in Example 4 was used; FIG. 12(a) and FIG. 12(b) are top views thereof and FIG. 12(b) is an enlarged view of the relevant part of FIG. 12(a); and FIG. 12(c) and FIG. 12(d) are side views thereof and FIG. 12(d) is an enlarged view of the relevant part of FIG. 12(c).

FIG. 13(a) to FIG. 13(d) are scanning electron micrographs in substitution for a drawing, showing a state of the surface of the contact probe pin after a contact test at the time when contact probe pin 4-0 in Reference Example was used; FIG. 13(a) and FIG. 13(b) are top views thereof and FIG. 13(b) is an enlarged view of the relevant part of FIG. 13(a); and FIG. 13(c) and FIG. 13(d) are side views thereof and FIG. 13(d) is an enlarged view of the relevant part of FIG. 13(c).

EXPLANATION OF REFERENCE

Figure 1:
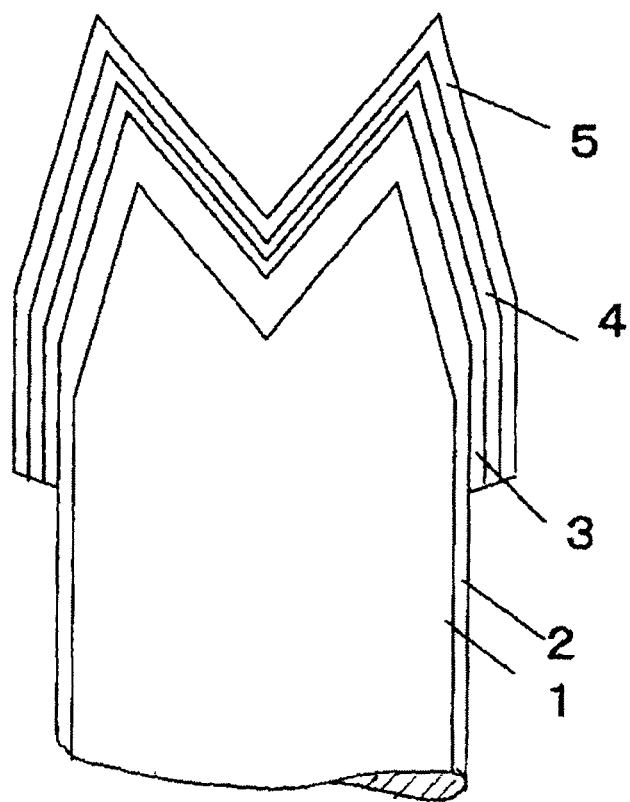
FIG. 1 is an illustration schematically showing a shape of a tip part of a contact probe pin of the invention.

1 Base material
2 Underlying layer
3 Inner layer composed on Ni or Ni alloy
4 Outer layer comprising at least one of Cr, Cr alloy, W and W alloy
5 Carbon film comprising a metal and/or a carbide thereof

DETAILED DESCRIPTION OF THE INVENTION

The present inventors have studied from various angles for forming a carbon film comprising a metal or a carbide thereof for imparting conductivity, on an electric contact member on which an underlying layer comprising Au, Au alloy, Pd or Pd alloy is formed, with good adhesion.

As a result, it has been found that when a layer having a lamination structure comprising a layer (inner layer) comprising Ni or Ni alloy and a layer (outer layer) comprising at least one of Cr, Cr alloy, W and W alloy is allowed to intervene as an intermediate layer between the underlying layer and the carbon film, not only adhesion of the carbon film is improved, thereby being able to inhibit the carbon film from being peeled off from a base material on which Au or Pd is formed, but also adhesion of an electrode constituting material (Sn or Sn alloy) and changes in resistance thereby are inhibited, thereby being able to realize stable contact resistance, thus completing the invention.

The carbon film has low reactivity as described above, and moreover is hard and high in internal stress. Accordingly, in order to stably adhere the carbon film on a metal, it is effective to allow a layer comprising Cr or W to intervene, and further to provide a gradient composition layer thereof as needed. In the electric contact member of the invention, it has become clear that the carbon film can be stably adhered to the underlying layer comprising Au or Pd by further allowing the layer comprising Ni or Ni alloy to intervene under the layer comprising Cr or W, as described above.

The reason why the layer comprising Ni or Ni alloy (hereinafter sometimes only referred to as the "Ni layer") shows good adhesion to the underlying layer comprising Au or Pd is considered to be that Ni has a wide solubility-limit to Au or Pd (solid solution over the whole region) to form no brittle intermetallic compound at an interface therebetween. That is to say, the interface between the Ni layer and the underlying layer of Au or Pd is expected to be in a state of an alloy in which both are mutually dissolved in solid.

In general, Ni is sometimes used as a ground for Au plating of a printed circuit board or the like, and no detailed investigation has hitherto been made of the effectiveness of the Ni layer as an adhesive layer in an inverse film structure (in the case where Au or Pd is an underlying layer). Further, Ni is a metal easily alloyable with Cr or W, so that Ni and Cr or Ni and W are a particularly excellent combination with respect to adhesiveness therebetween.

Not only from the metallurgical viewpoint as described above, but also in terms of the mechanical combination of materials, the combination (lamination structure) of the invention is particularly excellent. That is to say, when mechanical stress is applied to a surface of a hard material such as the carbon film, it becomes important to design in such a manner that the stress does not concentrate to the interface of the film to the utmost. For that purpose, it also becomes important to avoid the occurrence of the extreme difference in Young's modulus between the respective layers. The elastic modulus (Young's modulus) of thin films is in the ranges as described below, for respective raw materials (respective raw materials constituting films), although that kind of sweeping generalization cannot be made because the elastic modulus largely varies depending on methods for forming the films.

Au: 80 to 120 GPa
Pd: 110 to 150 GPa
Ni: 200 to 250 GPa
Cr: to 280 GPa
W: to 400 GPa
Carbon film: 200 to 300 GPa Au, Pd and the like are soft materials to the hard carbon film and Cr and W. Ni is an intermediate material therebetween, and is expected to reduce the stress at the interface between both described above. As described above, it is particularly effective and unique combination to the underlying layer comprising Au or Pd to use as an adhesive layer the layer having the lamination structure comprising the Ni layer and the layer (outer layer) comprising at least one of Cr, Cr alloy, W and W alloy.

For example, in the case where a Cr/C-based laminated film is coated on Au, when film is partially peeled off to expose Au, Sn easily alloyable with Au is easily adherable thereto. Once adhered, Sn is increasingly adhered at a rapidly accelerating rate from that portion as a starting point. Compared with this, when one Ni layer is allowed to intervene, Ni and Sn are mutually low in solid solubility limit, so that reactivity is low. As a result, even when defects partially occur in the Cr/C-based film as described above to expose the Ni layer, adhesion of Sn is inhibited because the reactivity of Ni with Sn is lower than that of Au with Sn. Thus, changes in contact resistance are small.

The Ni layer exhibiting the function as described above is basically consisting of Ni, but may be Ni alloy comprising an alloy element such as Cr, Fe, Co, V, Ti or P in an amount of 50 atomic % or less (preferably 10 to 30 atomic %). Even such Ni alloy (Ni based alloy) exhibits an effect equivalent to that of the layer consisting of Ni.

In addition, as the component composition of the Ni layer, minor components which are unavoidably mixed therein are not defined, and these unavoidable impurities are allowed to be mixed therein in a small amount unless the properties of the present invention are inhibited.

The Ni layer as described above can be formed, for example, by a sputtering method or the like. Although the thickness of this Ni layer is not particularly limited, it is desirably about 5 nm or more, in order to exhibit the function as the adhesive layer. However, when it is too thick, an influence unfavorable in use of the invention, such as an increase in surface unevenness due to crystalline growth, is likely to be found. Accordingly, it is preferably 5 μm or less. The thickness of the Ni layer is preferably 10 nm or more, more preferably 30 nm or more, and preferably 3 μm or less, more preferably 2 μm or less.

The Ni layer as described above is formed on the surface of the underlying layer comprising Au, Au alloy, Pd or Pd alloy with good adhesiveness. The surface of the underlying layer on which the Ni layer is formed may be subjected to a pretreatment such as plasma cleaning. This further improves the adhesiveness between the Ni layer and the underlying layer. Incidentally, the above-mentioned underlying layer comprises Au, Au alloy, Pd or Pd alloy, as described above, and is formed by plating or the like. The thickness thereof is preferably from about 0.01 μm to about 5 μm, more preferably about 0.5 μm to about 3 μm, further more preferably about 1 μm to about 2 μm, because it is within the range not increasing surface unevenness unnecessarily (similarly to the case of Ni) while functioning as an electric contact including durability in parts other than that on which the carbon film is formed. In addition, the base material itself of the probe may be Au alloy or Pd alloy.

In this connection, the underlying layer is preferably consisting essentially of Au, Au alloy, Pd or Pd alloy, and is more preferably consisting of Au, Au alloy, Pd or Pd alloy. Here, the Au alloy means an Au alloy with Co, Ni, Ag, Pd, Pt, Cu or the like, and the concentration of the Au is generally 30 atomic % or more, preferably 50 atomic % or more, and more preferably 70 atomic % or more. The concentration of the alloy element such as Co, Ni, Ag, Pd, Pt and Cu in the Au alloy is preferably 0.1 to 50 atomic %. In addition, the Pd alloy means a Pd alloy with Co, Au, Ag, Cu or the like, and the concentration of the Pd is generally 30 atomic % or more, and more preferably 70 atomic % or more. The concentration of the alloy element such as Co, Au, Ag and Cu in the Pd alloy is preferably 0.1 to 50 atomic %.

In addition, as the component composition of the underlying layer, minor components which are unavoidably mixed therein are not defined, and these unavoidable impurities are allowed to be mixed therein in a small amount unless the properties of the present invention are inhibited.

On the other hand, the outer layer (carbon film-side layer) in the intermediate layer is constituted by the layer comprising at least one of Cr, Cr alloy, W and W alloy (hereinafter sometimes referred to as the "Cr-, W-containing layer"). This layer includes various patterns. For example, there are (a) the case where the outer layer is constituted by any one layer of Cr, Cr alloy, W and W alloy, (b) the case where the outer layer is constituted by laminating two or more layers different in kind, (c) the case where plural sets of two or more layers different in kind are laminated, and further laminated in multiple layers, and the like. All of them can be employed.

In addition, as the component composition of the Cr-, W-containing layer, minor components which are unavoidably mixed therein are not defined, and these unavoidable impurities are allowed to be mixed therein in a small amount unless the properties of the present invention are inhibited.

The thickness (total thickness, in the case of multiple layers) of this Cr-, W-containing layer is preferably from about 5 nm to about 2 μm, and more preferably from about 10 nm to about 300 nm. The Cr-, W-containing layer formed by a method such as sputtering has a property of easily growing in a columnar form. When the film is thick, surface unevenness thereof becomes significant. This is unfavorable in use as the electric contact member, so that the upper limit of the preferred thickness is narrowed compared to the Ni layer.

The thickness of the carbon film formed on an uppermost surface is preferably from about 10 nm to about 10 μm, and more preferably from about 100 nm to about 2 μm. In terms of durability, it is preferred to be thick. However, when it is too thick, not only surface unevenness increases, but also film is peeled off due to internal stress, which poses an impediment to properties (contact resistance) as the electric contact member.

The metal or the carbide thereof is contained in the carbon film, and the content thereof determines the electric resistivity of the carbon film. Further, there is an optimum value in the content, depending on the shape and effective contact area of the contact terminal, the contact resistance value required at the time of test and the times of test required. From such viewpoints, the content of the metal or the carbide thereof in the carbon film is preferably from about 10 to about 30 atomic %, and more preferably from about 15 to about 25 atomic %.

Incidentally, when the metal contained in the carbon film is a metal that easily forms the carbide, it is uniformly dispersed in the carbon film, and an amorphous and uniform state is kept. From such a viewpoint, the metals allowed to be contained in the carbon film include W, Ta, Mo, Nb, Ti, Cr and the like, and one or more of these metals can be used. Of these, W is most preferred, considering stability of the carbide, and availability and cost.

The electric contact member of the invention has a basic structure in which the carbon film comprising the metal and/or the carbide thereof is formed on the surface of the underlying layer comprising Au, Au alloy, Pd or Pd alloy, with the interposition of the intermediate layer having the predetermined lamination structure. It is also useful to further form the gradient composition layer in which the carbon content gradiently increases (the content of the metal and/or the carbide in the carbon film decreases according thereto) from the base material side (that is to say, the intermediate layer side) to the carbon film side, between the above-mentioned intermediate layer and the carbon film, as needed. The adhesion between the uppermost surface of the carbon film and the above-mentioned intermediate layer can be further enhanced by employing such a structure.

Typical embodiments of the electric contact members of the invention include a contact probe pin, but are not limited thereto, and also include embodiments such as a member of a leaf spring shape and a member of another shape. That is to say, also in the electric contact members of these embodiments, portions corresponding to edges are present in some cases (for example, corner portions of springs, hemispheroidal projections and the like), and the shear stress as described above occurs in some cases. Further, also in the contact probe pin as described above, various shapes of a contact portion (portion in contact with the device under test) have been known. For example, there are ones divided into two parts, three parts and four parts (or not divided) and the like. The electric contact member of the invention includes all of them.

As the device under test (electrode) to be tested by the electric contact member of the invention, solder is commonly used. The solder typically comprises Sn, and particularly, Sn easily adheres to the surface of the contact probe pin. Accordingly, when the electric contact member of the invention is applied in the case where the device under test comprises Sn or Sn alloy, the effect is particularly effectively exhibited.

As the base material used in the electric contact member of the invention, there can be applied, for example, a base material composed of any one of beryllium copper (Be—Cu), palladium (Pd), an alloy thereof and carbon tool steel, but the base material is not limited thereto.

The invention will be described more specifically below with reference to examples. It should be noted, however, that the invention is not restricted in any way by these examples, and it is of course possible to carry out the invention with appropriate modification within the range conformable to the spirit described above and below. These are all included in the scope of the invention.

EXAMPLES

Example 1

A spring built-in probe with a tip part divided into four parts as shown in FIG. 1 was used as a contact probe pin. This contact probe pin was Au-plated on a surface thereof, and a base material 1 was made of Be—Cu. Incidentally, FIG. 1 schematically shows a state where the tip part is projected from the side, and the shape thereof is shown as two projections. Further, in FIG. 1, reference numeral 2 indicates an underlying layer, reference numeral 3 indicates an inner layer composed of Ni or Ni alloy, reference numeral 4 indicates an outer layer comprising at least one of Cr, Cr alloy, W and W alloy, and reference numeral 5 indicates a carbon film comprising a metal and/or a carbide thereof.

A carbon (graphite) target, a Cr target and a Ni target were each arranged in a magnetron sputtering chamber, and the contact probe pin was arranged in a position opposed to them.

After inside of the sputtering chamber was evacuated down to $6.7 \times 10^{-4}$ Pa or less, Ar gas was introduced to adjust the pressure to 0.13 Pa. After Ar ion etching was performed by applying high-frequency voltage to the base material, Ni was deposited to a thickness of 50 nm and Cr was deposited to a thickness of 50 nm to form an adhesive layer with the base material. Then, while further alternately forming Cr film and carbon film thereon, a gradient composition layer (not shown in FIG. 1) with the ratio of the carbon film gradually increased was formed (to a thickness of 100 nm). Finally, the graphite target with a W chip placed thereon was allowed to perform DC magnet discharge at an input power density of 5.66 W/cm$^2$, at the time of forming the carbon film of the uppermost surface, and a bias voltage of −100 V was applied to the base material, thereby performing coating to a thickness of about 400 nm (0.4 μm). At this time, a contact probe pin was prepared in the same manner as described above with the exception that no Ni layer was formed (Comparative Example).

Figure 2:
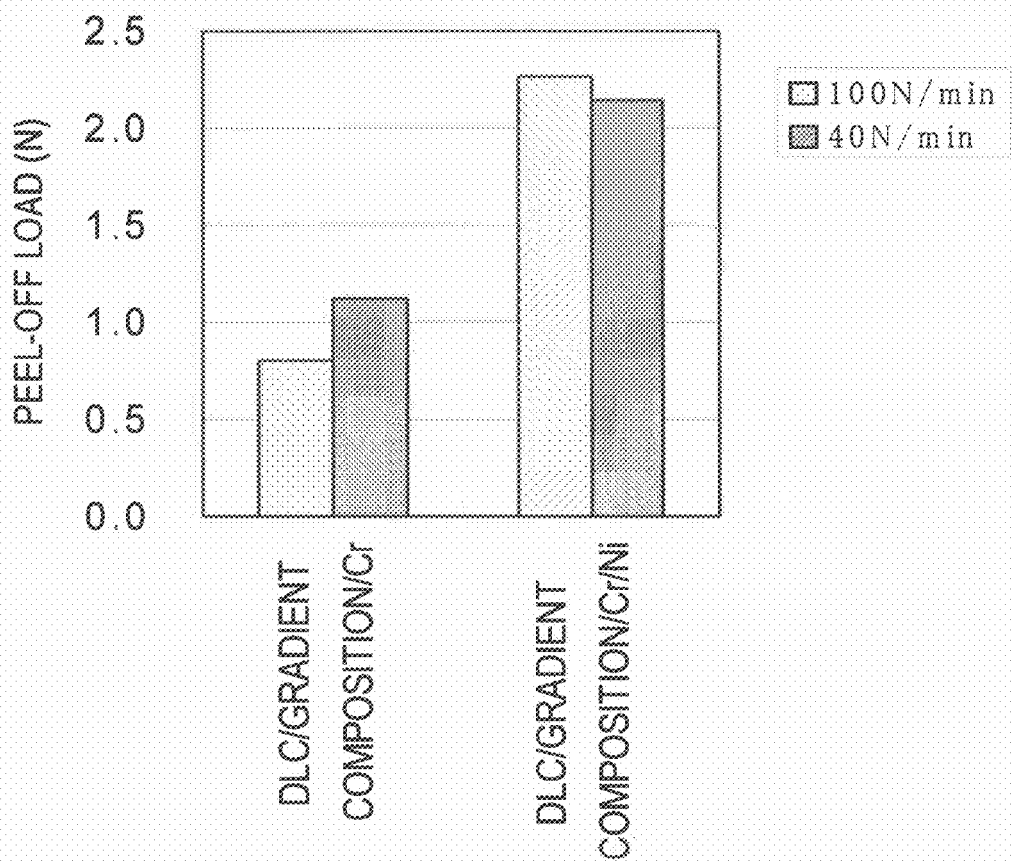
FIG. 2 is a bar graph showing the results of a scratch test in Example 1.

Using plates in which the films were similarly formed on the base material concurrently with the above-mentioned respective contact probe pin, a scratch test for evaluating the adhesion was conducted. The scratch evaluation was made under conditions of a table rate of 10 mm/min and two load rates of 40 N/min and 100 N/min using a commercially available scratch tester, and the peel-off load (load at the time when the Au underlying layer was exposed) was measured, thereby evaluating the adhesiveness. The results thereof are shown in FIG. 2 (the result of Example is indicated as "DLC/gradient composition/Cr/Ni", and the result of Comparative Example is indicated as "DLC/gradient composition/Cr"). As apparent from these results, it is known that the one in which the Ni layer was inserted is significantly improved in adhesion.

Using the respective contact probe pin with carbon films formed above, contact were performed 100,000 times to an electrode composed of lead-free solder (Sn+3 atomic % Cu+0.5 atomic % Ag), and film peel-off of the tip parts was observed. Further, in order to confirm the presence or absence of stability of the electric resistance due to film peel-off, a current of 100 mA was turned on for each contact, and changes in electric resistance (changes in resistance) were determined. However, the measurement of the resistance was made once pre 100 times.

Figure 4:
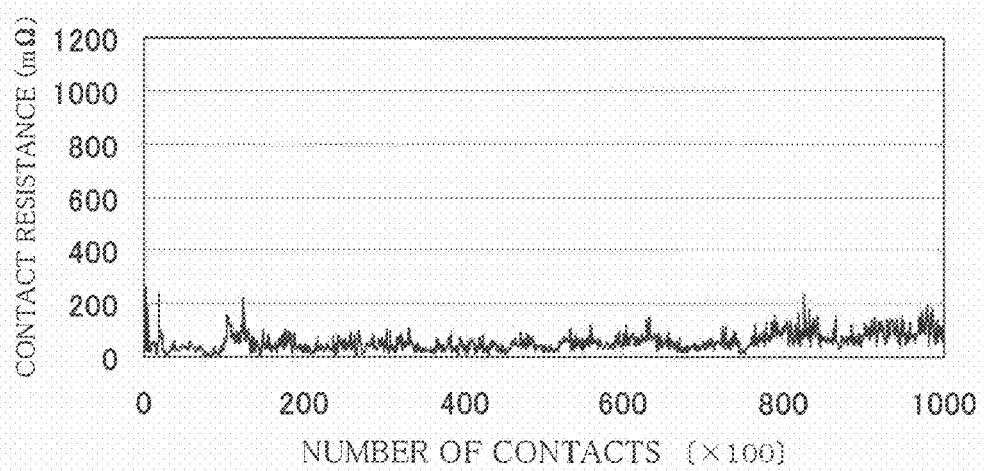
FIG. 4 is a graph showing changes in electric resistance at the time when a contact probe pin in Example 1 was used.

The state of the tip part after 100,000 times of contact at the time when the contact probe pin of the invention was used is shown in FIG. 3(a) and FIG. 3(b) (scanning electron micrographs in substitution for a drawing, showing the state of the tip part). FIG. 3(b) is an enlarged view of the part surrounded by a solid line in FIG. 3(a). Further, changes in electric resistance (the relationship between the times of contact and the changes in resistance) at this time are shown in FIG. 4.

Figure 6:
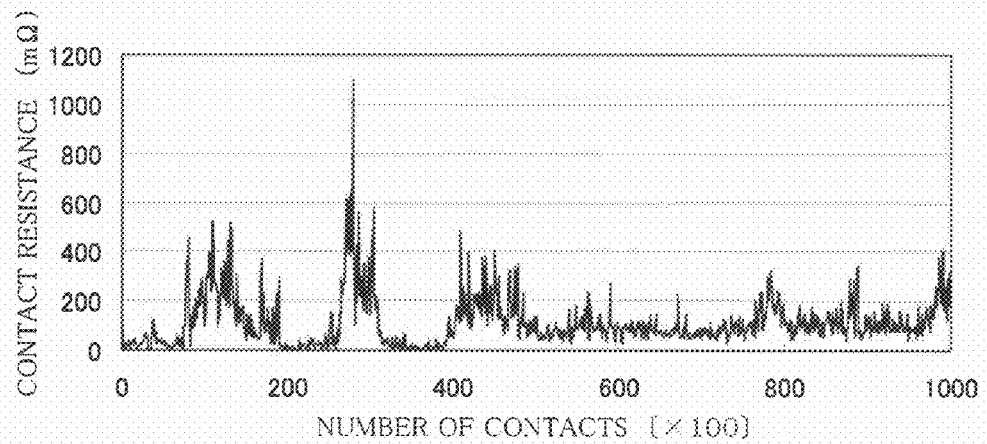
FIG. 6 is a graph showing changes in electric resistance at the time when a contact probe pin in Comparative Example was used.

The state of the tip part after 100,000 times of contact at the time when the contact probe pin of the comparative example (in which no Ni layer was formed) was used is shown in FIG. 5(a) and FIG. 5(b) (scanning electron micrographs in substitution for a drawing, showing the state of the tip part). FIG. 5(b) is an enlarged view of the part surrounded by a solid line in FIG. 5(a). Further, changes in electric resistance (the relationship between the times of contact and the changes in resistance) at this time are shown in FIG. 6.

In the contact probe pin in which no Ni layer was formed and only the Cr layer was used as the intermediate layer, it could be confirmed that the carbon film at the surface was peeled off causing the surface of the Au alloy to be exposed (see the part surrounded by a dotted line in FIG. 5(b)). It is revealed that changes in resistance also increase under the influence thereof (FIG. 6). The allowance of changes in resistance varies depending on the kind of device under test and the like. However, supposing that changes of 500 mΩ are allowed, it is known that the contact probe pin of the invention can contact with the device under test 100,000 times or more, although the limit is about 10,000 times in the comparative example.

Example 2

A contact probe pin with a carbon film was prepared by forming, in turn, a Ni layer, Cr layer, gradient composition layer and a carbon film in the same manner as in Example 1 with the exception that a contact probe pin (having a tip part divided into four parts as with Example 1) in which Pd (an underlying layer) was plated on the surface of the base material 1 made of Be—Cu was used.

Figure 7:
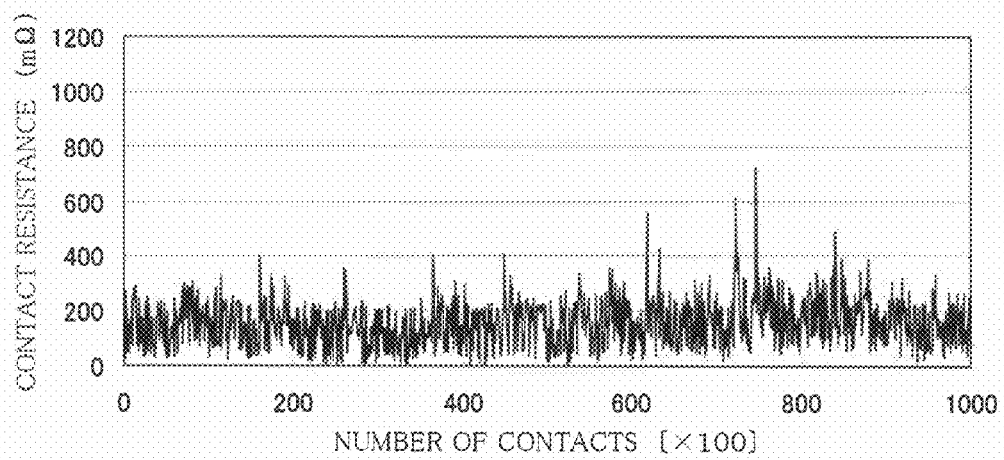
FIG. 7 is a graph showing changes in electric resistance at the time when a contact probe pin in Example 2 was used.

Using the contact probe pin with a carbon film formed above, contact were performed 100,000 times to an electrode composed of lead-free solder (Sn+3 atomic % Cu+0.5 atomic % Ag), and the state of film peel-off of the tip part was observed, and in order to confirm the presence or absence of stability of the electric resistance value due to film peel-off, a current of 100 mA was turned on for each contact, and changes in electric resistance (changes in resistance) were determined (however, the measurement of the resistance was made once pre 100 times). Changes in electric resistance (the relationship between the times of contact and the changes in resistance) at the time when this contact probe pin was used are shown in FIG. 7. As a result, no increase in resistance value due to film peel-off is observed, and changes in resistance value are stable. It is revealed that stable measurement without additional treatments such as cleaning of the probe is possible up to about 60,000 times.

Example 3

A contact probe pin with a carbon film was prepared by forming, in turn, a Ni layer, Cr layer, gradient composition layer and a carbon film in the same manner as in Example 1 with the exception that a commercially available contact probe pin in which the base material 1 is a Pd alloy (having a tip part divided into four parts as with Example 1) was used.

Using the contact probe pin with a carbon film formed above, contact was performed 100,000 times to an electrode composed of lead-free solder (Sn+3 atomic % Cu+0.5 atomic % Ag), and the state of film peel-off of the tip part was observed. As a result, film peel-off was not observed, and it was confirmed that an adhesiveness of a stable film could be secured as with Example 2.

Example 4

A contact probe pin with a carbon film (contact probe pin 4-1) was prepared by forming, in turn, a Ni layer, Cr layer, gradient composition layer and a carbon film in the same manner as in Example 1 with the exception that a commercially available contact probe pin, in which the base material 1 is Be—Cu and is plated with Ni and Au in this order on a surface thereof (i.e. a Ni plating layer and Au plating layer are formed in this order on the base material Be—Cu), and the tip part thereof has only one edge. In addition, contact probe pin 4-2 was prepared in the same manner as in the contact probe pin 4-1 with the exception that the thickness of the Ni layer was changed from 50 nm to 2 μm.

Figure 8:
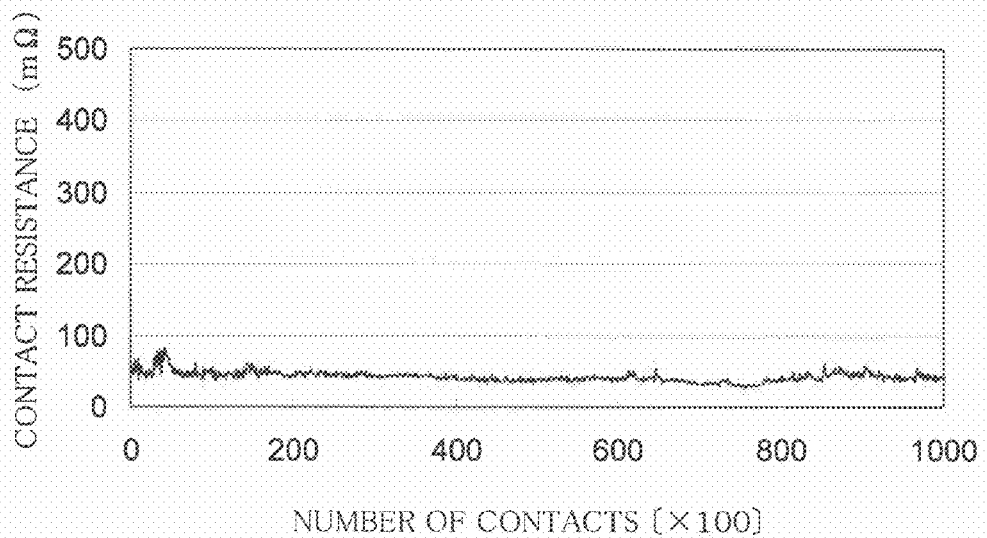
FIG. 8 is a graph showing changes in electric resistance at the time when contact probe pin 4-1 in Example 4 was used.
Figure 9:
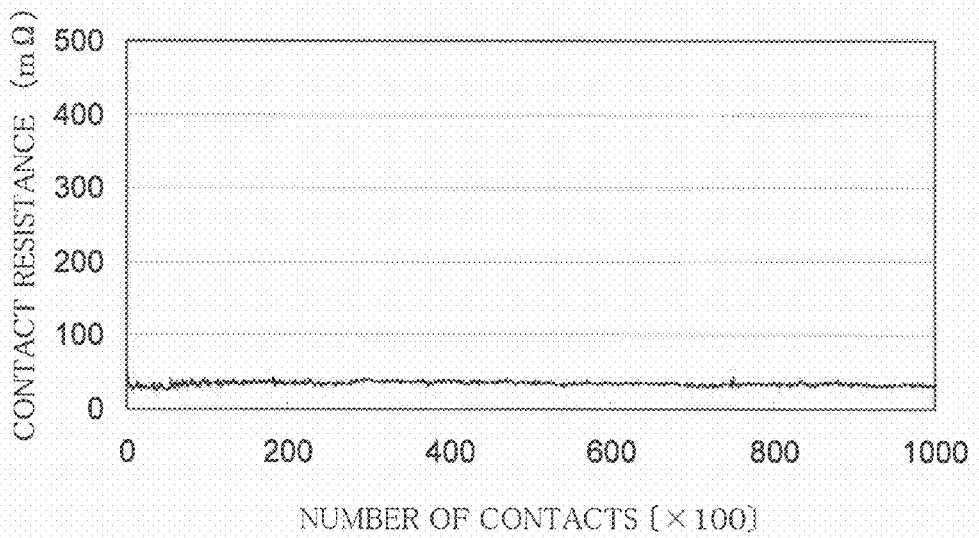
FIG. 9 is a graph showing changes in electric resistance at the time when contact probe pin 4-2 in Example 4 was used.

A plate having a laminate structure similar to Pd-PPF (Palladium Pre Plated Lead Frame: Ni plating having a thickness of about 0.6 μm, Pd plating are formed on Cu alloy material and Au ultrathin layer is formed at the outermost thereof, and the total thickness of the Ni plating, Pd plating and Au ultrathin layer is about 20 nm), which is one kind of an IC electrode, was prepared, and continuous contact was performed 100,000 times thereto using each of the contact probe pins 4-1 and 4-2 with a stroke designed for a contact probe pin under a condition at 130° C. (the conditions such as a current were same as that of Example 1). The changes in electric resistance was shown in FIG. 8 (contact probe pin 4-1) and FIG. 9 (contact probe pin 4-2), respectively. In addition, the SEM observation results of the surface of the contact probe pin 4-1 after test are shown in FIG. 11(a) to FIG. 11(d), wherein FIG. 11(a) and FIG. 11(b) are the SEM observation results viewed from top, and FIG. 11(b) is an enlarged view of the part surrounded by a solid line in FIG. 11(a); and FIG. 11(c) and FIG. 11(d) are the SEM observation results viewed from side, and FIG. 11(d) is an enlarged view of the part surrounded by a solid line in FIG. 11(c). In addition, the SEM observation results of the surface of the contact probe pin 4-2 after test are shown in FIG. 12(a) to FIG. 12(d), wherein FIG. 12(a) and FIG. 12(b) are the SEM observation results viewed from top, and FIG. 12(b) is an enlarged view of the part surrounded by a solid line in FIG. 12(a); and FIG. 12(c) and FIG. 12(d) are the SEM observation results viewed from side, and FIG. 12(d) is an enlarged view of the part surrounded by a solid line in FIG. 12(c).

As a result of the contact test in which each of the contact probe pins was contacted with Pd-PPF which is harder than Sn, Sn alloy and the like, it was confirmed that the peel-off or the like of the DLC was not occurred, but the tip part of the probe pin was deformed due to the large stress by contact, even when the DLC-coated contact probe pin 4-1 which intrinsically shows excellent durability was used. On the other hand, it was confirmed that deformation and the like were not occurred at all by using the contact probe pin 4-2 having the larger thickness of the Ni layer. This is because, by increasing the thickness of a Ni layer, the stress generated in the carbon film was relaxed to prevent from being damaged or deformed and further high durability could be realized.

Reference Example

Figure 10:
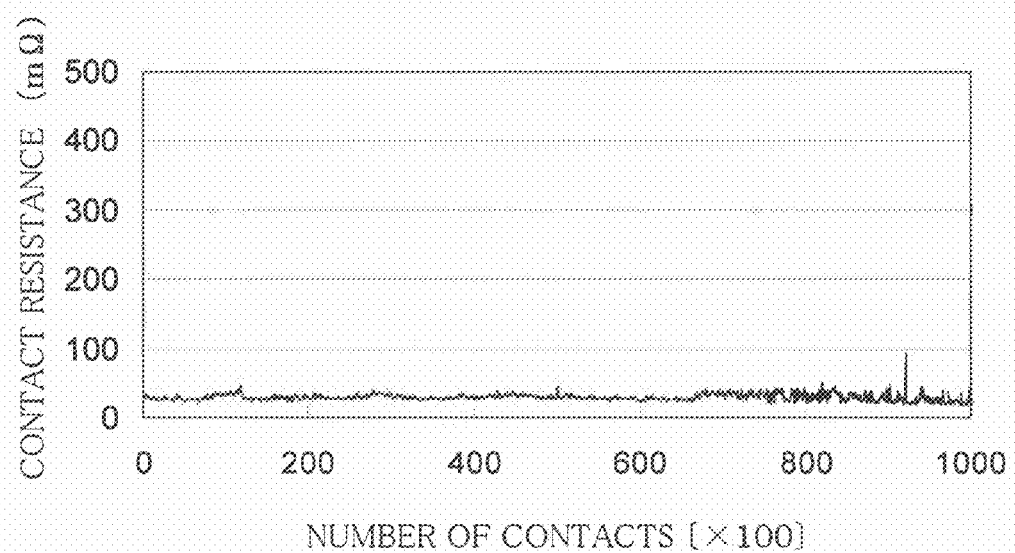
FIG. 10 is a graph showing changes in electric resistance at the time when contact probe pin 4-0 in Reference Example was used.

Using the commercially available contact probe pin itself used in Example 4, i.e. a contact probe pin (contact probe pin 4-0) in which a Ni layer, Cr layer, gradient composition layer and a carbon film are not formed thereon unlike the contact probe pins 4-1 and 4-2, continuous contact was performed 100,000 times in the same manner as in Example 4. The change in electric resistance is shown in FIG. 10. In addition, the SEM observation results of the surface of the contact probe pin after test are shown in FIG. 13(a) to FIG. 13(d), wherein FIG. 13(a) and FIG. 13(b) are the SEM observation results viewed from top, and FIG. 13(b) is an enlarged view of the part surrounded by a solid line in FIG. 13(a) wherein "Cu" described in FIG. 13(b) represents Cu derived from base material (Be—Cu); and FIG. 13(c) and FIG. 13(d) are the SEM observation results viewed from side, and FIG. 13(d) is an enlarged view of the part surrounded by a solid line in FIG. 13(c). As is clear from FIG. 13(a) to FIG. 13(d), the contact surface was largely scrapped off due to the large stress by contact, and the base material was exposed in the contact probe pin 4-0 which does not meet the requirement of the present invention. Compared to this Reference Example, the deformation of the probe was significantly small even in the case of using the contact probe pin 4-1, and it is found that the durability of the probe is highly improved, since wear and wasting were not confirmed. It is clear that the advantage thereof is much higher in the case of using contact probe pin 4-2.

What is claimed is:

1. An electric contact member which repeatedly contacts with a device under test at a tip part of the electric contact member in which the tip part has an edge, the electric contact member comprising:
   a base material;
   an underlying layer comprising Au, Au alloy, Pd or Pd alloy, which is formed on a surface of the base material of the tip part;
   an intermediate layer which is formed on a surface of the underlying layer; and
   a carbon film comprising at least one of a metal and a carbide thereof which is formed on a surface of the intermediate layer,
   wherein the intermediate layer has a lamination structure comprising: an inner layer comprising Ni or Ni alloy; and an outer layer comprising at least one of Cr, Cr alloy, W and W alloy.

2. The electric contact member according to claim 1, wherein the metal contained in the carbon film is one or more kinds of metals selected from the group consisting of W, Ta, Mo, Nb, Ti and Cr.

3. The electric contact member according to claim 1, wherein an amount of at least one of the metal and carbide thereof in the carbon film is from 10 to 30 atomic %.

4. The electric contact member according to claim 1, wherein a thickness of the carbon film is from 10 nm to 10 μm.

5. The electric contact member according to claim 1, wherein the device under test comprises Sn or Sn alloy.

* * * * *